United States Patent
Wang

(10) Patent No.: US 11,637,138 B2
(45) Date of Patent: Apr. 25, 2023

(54) TILTED TRANSFER GATE FOR ADVANCED CMOS IMAGE SENSOR

(71) Applicant: OMNIVISION TECHNOLOGIES, INC., Santa Clara, CA (US)

(72) Inventor: Qin Wang, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 101 days.

(21) Appl. No.: 17/187,396

(22) Filed: Feb. 26, 2021

(65) Prior Publication Data

US 2022/0278148 A1    Sep. 1, 2022

(51) Int. Cl.
*H01L 27/146* (2006.01)
*H01L 21/306* (2006.01)

(52) U.S. Cl.
CPC .. *H01L 27/14616* (2013.01); *H01L 27/14614* (2013.01); *H01L 27/14641* (2013.01); *H01L 27/14689* (2013.01); H01L 21/30608 (2013.01)

(58) Field of Classification Search
CPC ......... H01L 27/14616; H01L 27/14603; H01L 27/14614; H01L 27/14641; H01L 27/14689; H01L 27/14643; H01L 21/30608; H01L 29/66621
See application file for complete search history.

(56) References Cited

U.S. PATENT DOCUMENTS

| | | | | |
|---|---|---|---|---|
| 2006/0124976 | A1* | 6/2006 | Adkisson | H01L 27/14601 257/E21.429 |
| 2011/0089311 | A1* | 4/2011 | Venezia | H01L 27/14689 257/E31.073 |
| 2012/0306007 | A1* | 12/2012 | Yanagisawa | H01L 29/4236 438/270 |
| 2013/0076934 | A1* | 3/2013 | Maeda | H04N 5/37457 348/222.1 |
| 2015/0372034 | A1* | 12/2015 | Chen | H01L 27/14614 257/334 |
| 2016/0043120 | A1* | 2/2016 | Ahn | H01L 27/14614 257/229 |
| 2017/0104021 | A1* | 4/2017 | Park | H01L 27/14643 |
| 2021/0305297 | A1* | 9/2021 | Tian | H01L 27/1463 |

* cited by examiner

*Primary Examiner* — Nilufa Rahim
(74) *Attorney, Agent, or Firm* — Perkins Coie LLP

(57) ABSTRACT

A pixel circuit includes a trench etched into a front side surface of a semiconductor substrate. The trench includes a bottom surface etched along a <100> crystalline plane and a tilted side surface etched along a <111> crystalline plane that extends between the bottom surface and the front side surface. A floating diffusion is disposed in the semiconductor substrate beneath the bottom surface of the trench. A photodiode is disposed in the semiconductor substrate beneath the tilted side surface of the trench and is separated from the floating diffusion. The photodiode is configured to photogenerate image charge in response to incident light. A tilted transfer gate is disposed over at least a portion of the bottom surface and at least a portion of the tilted side surface of the trench. The tilted transfer gate is configured to transfer the image charge from the photodiode to the floating diffusion.

26 Claims, 11 Drawing Sheets

TILTED TRANSFER GATE FOR ADVANCED CMOS IMAGE SENSOR

BACKGROUND INFORMATION

Field of the Disclosure

This disclosure relates generally to image sensors, and in particular but not exclusively, relates to image sensor pixel circuits including tilted transfer gates.

Background

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical complementary metal oxide semiconductor (CMOS) image sensor operates in response to image light from an external scene being incident upon the image sensor. The image sensor includes an array of pixel circuits having photosensitive elements (e.g., photodiodes) that absorb a portion of the incident image light and generate image charge upon absorption of the image light. The image charge photogenerated by the photosensitive elements may be transferred to a floating diffusion within the pixel circuits. The image charge transferred to the floating diffusion may be read out from the pixel circuits through analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
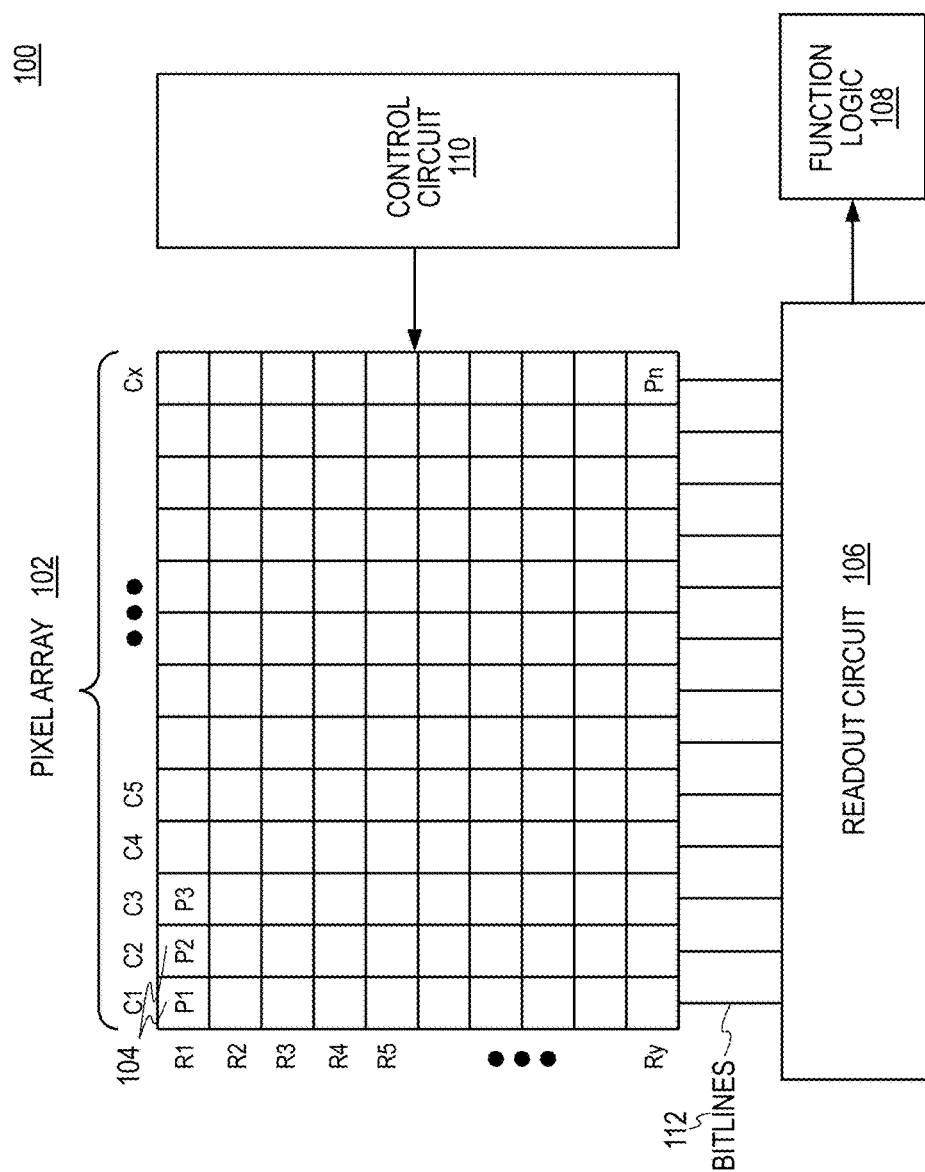
FIG. 1 illustrates one example of an imaging system including a pixel array with pixel circuits that utilize example tilted transfer gates in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to a complementary metal oxide semiconductor (CMOS) image sensor with pixel circuits including tilted transfer gates are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of advanced CMOS sensors are disclosed, which include pixel circuits with tilted transfer gates. In the various examples, each pixel circuit includes a trench etched into a front side surface of a semiconductor substrate. The trench includes a bottom surface etched along a <100> crystalline plane of the semiconductor substrate and a tilted side surface etched along a <111> crystalline plane of the semiconductor substrate that extends between the bottom surface and the front side surface of the semiconductor substrate. A floating diffusion is disposed in the semiconductor substrate beneath the bottom surface of the trench and at least one photodiode is included in the pixel circuit and is disposed in the semiconductor substrate beneath the tilted side surface of the trench. A tilted transfer gate is disposed over at least a portion of the bottom surface of the trench and at least a portion of the tilted side surface of the trench. The tilted transfer gate is configured to transfer image charge from the photodiode to the floating diffusion.

In the various examples, the photodiode is disposed sufficiently beneath the surface of the semiconductor substrate such that white pixel (WP)/dark current (DC) performance of the image sensor is improved since the shallow portion of the photodiode is not at the surface of the semiconductor substrate. In addition, with the tilted transfer gate disposed over at least portions of the bottom and tilted side surfaces of the trench, the charge transfer path of image charge from the photodiode to the floating diffusion and a blooming path or charge leakage path of image charge from the deep portion of the photodiode through the semiconductor substrate to the floating diffusion are separated or non-overlapping paths.

To illustrate, FIG. 1 illustrates generally one example of an imaging system 100 including a CMOS image sensor from which image signals are read out in accordance with an embodiment of the present disclosure. As shown, the example imaging system 100 includes a pixel array 102 from which image signals are read out through column bitlines 112 to a readout circuit 106. In one example, the image signals in readout circuit 106 may be processed and/or stored in function logic 108, and operations in pixel array 102 are controlled in response to a control circuit 110. In the illustrated example, pixel array 102 is a two-dimensional (2D) array including a plurality of pixel circuits 104, which include photodiodes (e.g., P1, P2, . . . , Pn). As illustrated in the depicted example, the pixel circuits 104 are arranged into rows (e.g., R1 to Ry) and columns (e.g., Cl to Cx) to acquire image data of a person, place, object, etc., which can then be used to render an image of a person, place, object, etc.

In various examples, each pixel circuit 104 may include one or more photodiodes (e.g., one photodiode, four photodiodes, etc.) In the various examples, each photodiode in pixel circuit 104 is configured to photogenerate image charge in response to incident light. As will be discussed in greater detail below, the image charge generated in each photodiode is transferred to a floating diffusion in each pixel circuit 104 through a tilted transfer gate in accordance with the teachings of the present invention. The image charge in each floating diffusion of the pixel array 102 may then be converted to an image signal, which is read out from each pixel circuit 104 of the pixel array 102 by readout circuit 106 through column bitlines 112. In the various examples, the image charge from each row of pixel circuits 104 may be read out in parallel through column bitlines 112 by readout circuit 106. In various examples, the image charge signals are analog signals that are converted to digital values in readout circuit 106, which are then transferred to function logic 108. In various examples, the digital values may be normalized through correlated double sampling (CDS) processing or the like. The function logic 108 may store the image data or even manipulate the image data by applying post image effects (e.g., crop, rotate, remove red eye, adjust brightness, adjust contrast, or otherwise).

Figure 2:
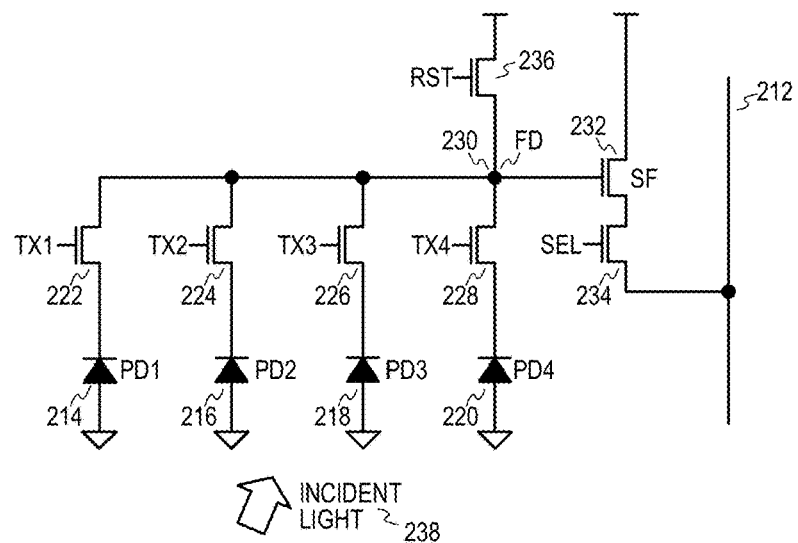
FIG. 2 is a schematic illustrating one example of a pixel circuit with example tilted transfer gates in accordance with the teachings of the present invention.

FIG. 2 is a schematic illustrating one example of a pixel circuit 204 with example tilted transfer gates in accordance with the teachings of the present invention. It is appreciated that the example schematic of pixel circuit 204 of FIG. 2 may be one example of one of the pixel circuits 104 of the pixel array 102 as shown in FIG. 1, and that similarly named and numbered elements described above are coupled and function similarly below.

In the depicted example, pixel circuit 204 includes a plurality of photodiodes, including photodiode PD1 214, photodiode PD2 216, photodiode PD3 218, and photodiode PD4 220. It is appreciated that in the depicted example, pixel circuit 204 includes four photodiodes for explanation purposes, and that in another example, pixel circuit 204 may also include a different number of photodiodes or a single photodiode in accordance with the teachings of the present invention.

Continuing with the example illustrated in FIG. 2, each of the one or more photodiodes including photodiode PD1 214, photodiode PD2 216, photodiode PD3 218, and photodiode PD4 220, is configured to photogenerate image charge in response to incident light 238. In the depicted example, pixel circuit 204 also includes a floating diffusion FD 230, which is coupled to receive the image charge from the plurality of photodiodes, including photodiode PD1 214, photodiode PD2 216, photodiode PD3 218, and photodiode PD4 220.

The example depicted in FIG. 2 also shows a plurality of transfer gates including a first transfer gate 222, second transfer gate 224, third transfer gate 226, and fourth transfer gate 228, which are coupled between floating diffusion FD 230 and the respective photodiodes, including photodiode PD1 214, photodiode PD2 216, photodiode PD3 218, and photodiode PD4 220. In operation, the first transfer gate 222, second transfer gate 224, third transfer gate 226, and fourth transfer gate 228 are configured to transfer the image charge photogenerated in photodiode PD1 214, photodiode PD2 216, photodiode PD3 218, and photodiode PD4 220 to floating diffusion FD 230 in response to transfer gate signals TX1, TX2, TX3, and TX4, respectively. As will be discussed, in the various examples, first transfer gate 222, second transfer gate 224, third transfer gate 226, and fourth transfer gate 228 are tilted transfer gates in accordance with the teachings of the present invention.

The illustrated example shows that pixel circuit 204 also includes a source follower transistor SF 232 having a drain coupled to a supply voltage and a gate coupled to the floating diffusion FD 230. A row select transistor 234 is coupled to a source of the source follower transistor SF 232 and a column bitline 212, and is coupled to be controlled in response to a select signal SEL. In operation, the source follower transistor SF 232 is coupled to output an image signal to the bitline 212 through select transistor 234 in response to the image charge in the floating diffusion FD 230. In one example, a readout circuit (e.g., readout circuit 106) is coupled to bitline 212 to read out the image signal from bitline 212. A reset transistor 236 is coupled between the supply voltage and the floating diffusion FD 230 and is coupled to reset the pixel circuit 204 in response to a reset control signal RST. In operation, reset transistor 238 may be configured to reset the floating diffusion FD 230, as well as reset photodiode PD1 214, photodiode PD2 216, photodiode PD3 218, and photodiode PD4 220.

Figure 3:
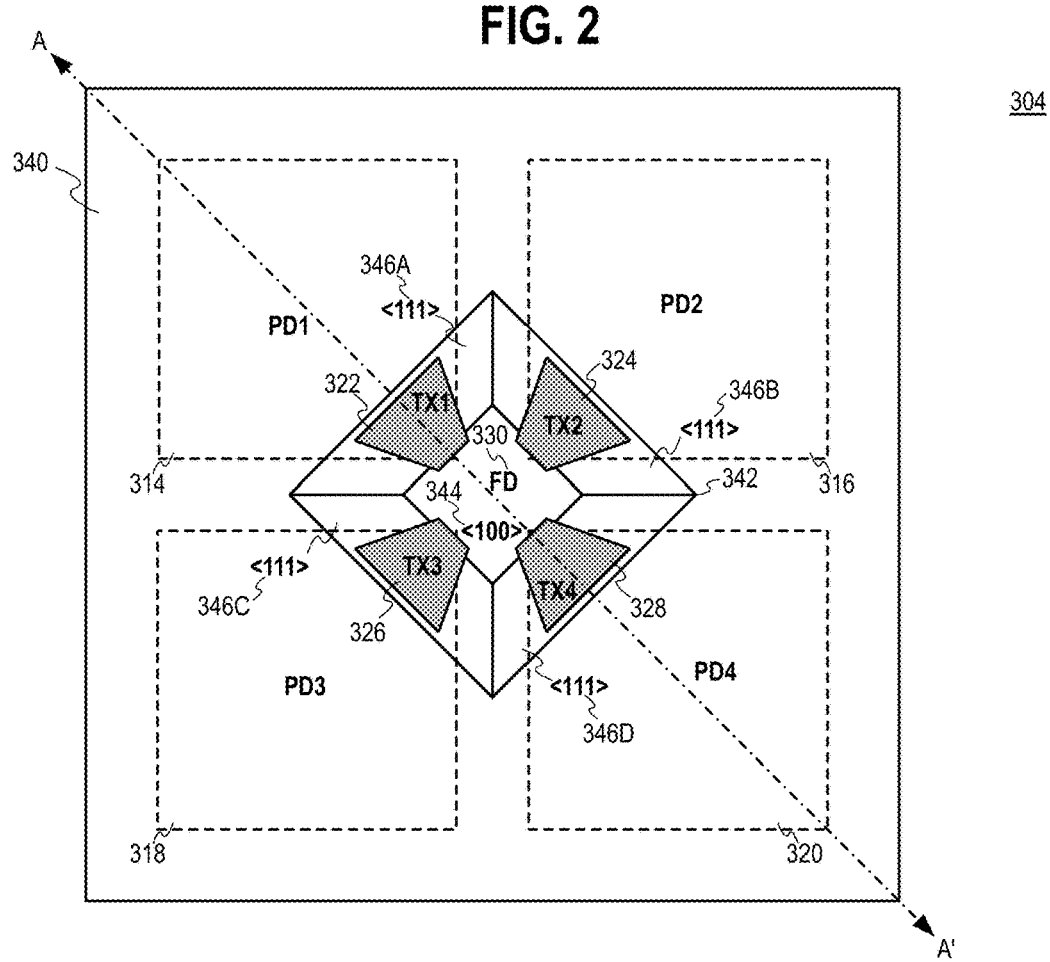
FIG. 3 is a plan view of a portion of an example pixel circuit including example tilted transfer gates disposed over photodiodes and a floating diffusion disposed in a semiconductor substrate in accordance with the teachings of the present invention.

FIG. 3 is a plan view of a portion of an example pixel circuit 304 including example tilted transfer gates disposed over photodiodes and a floating diffusion disposed in a semiconductor substrate in accordance with the teachings of the present invention. It is appreciated that the example of pixel circuit 304 of FIG. 3 may be one example of one of the pixel circuit 204 of FIG. 2 or of pixel circuits 104 of the pixel array 102 as shown in FIG. 1, and that similarly named and numbered elements described above are coupled and function similarly below.

As shown in the plan view example depicted in FIG. 3, pixel circuit 304 includes a trench 342 etched into a front side surface of a semiconductor substrate 340. In the example, the trench 342 includes a bottom surface 344 etched along a <100> crystalline plane of the semiconductor substrate 340, and a first tilted side surface 346A, a second tilted side surface 346B, a third tilted side surface 346C, and a fourth tilted side surface 346D, etched along respective <111> crystalline planes of the semiconductor substrate 340 that extend between the bottom surface 344 and the front side surface of the semiconductor substrate 340 in accordance with the teachings of the present invention.

The depicted example also illustrates that pixel circuit 304 includes a floating diffusion FD 330, which is disposed in the semiconductor substrate 340 beneath the bottom surface 344 of the trench 342. As shown in the example, pixel circuit 304 also includes a first photodiode PD1 314 disposed in the semiconductor substrate 340 beneath the first tilted side surface 346A, a second photodiode PD2 316 disposed in the semiconductor substrate 340 beneath the second tilted side surface 346B, a third photodiode PD3 314 disposed in the semiconductor substrate 340 beneath the third tilted side surface 346C, and a fourth photodiode PD4 320 disposed in the semiconductor substrate 340 beneath the fourth tilted side surface 346D. In one example, each of the first photodiode PD1 314, second photodiode PD2 316, third photodiode PD3 318, and fourth photodiode PD4 320 have a width of approximately 0.8-1 μm. In the example, it is appreciated that the first photodiode PD1 314, second photodiode PD2 316, third photodiode PD3 318, and fourth photodiode PD4 320 are all separated from the floating diffusion FD 330 in the semiconductor substrate 340. In operation, the first photodiode PD1 314, second photodiode PD2 316, third photodiode PD3 318, fourth photodiode PD4 320 are configured to photogenerate image charge in response to incident light.

In the various examples, it is appreciated that the floating diffusion FD 330, the first photodiode PD1 314, second photodiode PD2 316, third photodiode PD3 318, fourth photodiode PD4 320 are all disposed in an isolation region of the semiconductor substrate 340. In one example, the semiconductor substrate 340 is a silicon substrate and the isolation region is formed in the silicon substrate as a P-well isolation region implanted with P-type dopants, e.g., boron, having an opposite conductivity type than N type dopants (e.g., phosphorus, arsenic) that are implanted to form photodiodes PD1 314, PD2 316, PD3 318, PD4 320, and floating diffusion FD 330. In one example, the isolation region includes a shallow well and a deep well implanted therein between adjacent photodiodes, for example between photodiodes PD1 314 and its adjacent photodiodes PD2 316, PD3 318, PD4 320, wherein the deep well is extended from the shallow well. In one example, isolation region is an epitaxial layer (e.g., in-situ P-type doped epitaxial layer) grown on the semiconductor substrate 340. In one example, the photodiode regions of the first photodiode PD1 314, second photodiode PD2 316, third photodiode PD3 318, fourth photodiode PD4 320 are all fabricated using photolithography and implantation to form shallow N-type photodiode regions (NPPD) and deep N-type photodiode regions (DNPPD).

Continuing with the depicted example, a first tilted transfer gate 322 is disposed over at least a portion of the bottom surface 344 of the trench 342 and at least a portion of the first tilted side surface 346A of the trench 342. A second tilted transfer gate 324 is disposed over at least a portion of the bottom surface 344 of the trench 342 and at least a portion of the second tilted side surface 346B of the trench 342. A third tilted transfer gate 326 is disposed over at least a portion of the bottom surface 344 of the trench 342 and at least a portion of the third tilted side surface 346C of the trench 342. A fourth tilted transfer gate 328 is disposed over at least a portion of the bottom surface 344 of the trench 342 and at least a portion of the fourth tilted side surface 346D of the trench 342. In one example, the first tilted transfer gate 322, the second tilted transfer gate 324, the third tilted transfer gate 326, and the fourth tilted transfer gate 328 are formed with polysilicon. In operation, the first tilted transfer gate 322, the second tilted transfer gate 324, the third tilted transfer gate 326, and the fourth tilted transfer gate 322 are configured to transfer the image charge from first photodiode PD1 314, second photodiode PD2 316, third photodiode PD3 318, and fourth photodiode PD4 320 to the floating diffusion FD 330 in response to gate transfer signals TX1, TX2, TX3, and TX4, respectively.

In the various examples, the layout of the trench 342 is polygon shaped. For instance, in the example depicted in FIG. 3, the layout of trench layout 342 is a four-sided polygon, or square, that is oriented at 45 degrees with respect to the <100> crystalline plane of the semiconductor substrate 340 such that the sides or edges of the square are parallel to the respective <111> crystalline planes of the semiconductor substrate 340. As will be discussed below, in the various examples, during fabrication, the etching rate for the <100> crystalline plane is higher than the etching rate for other crystalline planes, such as the <111> crystalline plane, which therefore form a slope on inclined plane for the first tilted side surface 346A, the second tilted side surface 346B, the third tilted side surface 346C, and the fourth tilted side surface 346D in accordance with the teachings of the present invention. In addition, since the layout of trench 342 is symmetrical across the four photodiodes including first photodiode PD1 314, second photodiode PD2 316, third photodiode PD3 318, and fourth photodiode PD4 320, the structure of trench 342 is also symmetrical. Furthermore, in the depicted example, the first tilted transfer gate 322, the second tilted transfer gate 324, the third tilted transfer gate 326, and the fourth tilted transfer gate 322 can also have substantially the same structure as the tilted sides of the trench 342 (e.g., substantially the same gate length and substantially the same gate width).

Figure 4:
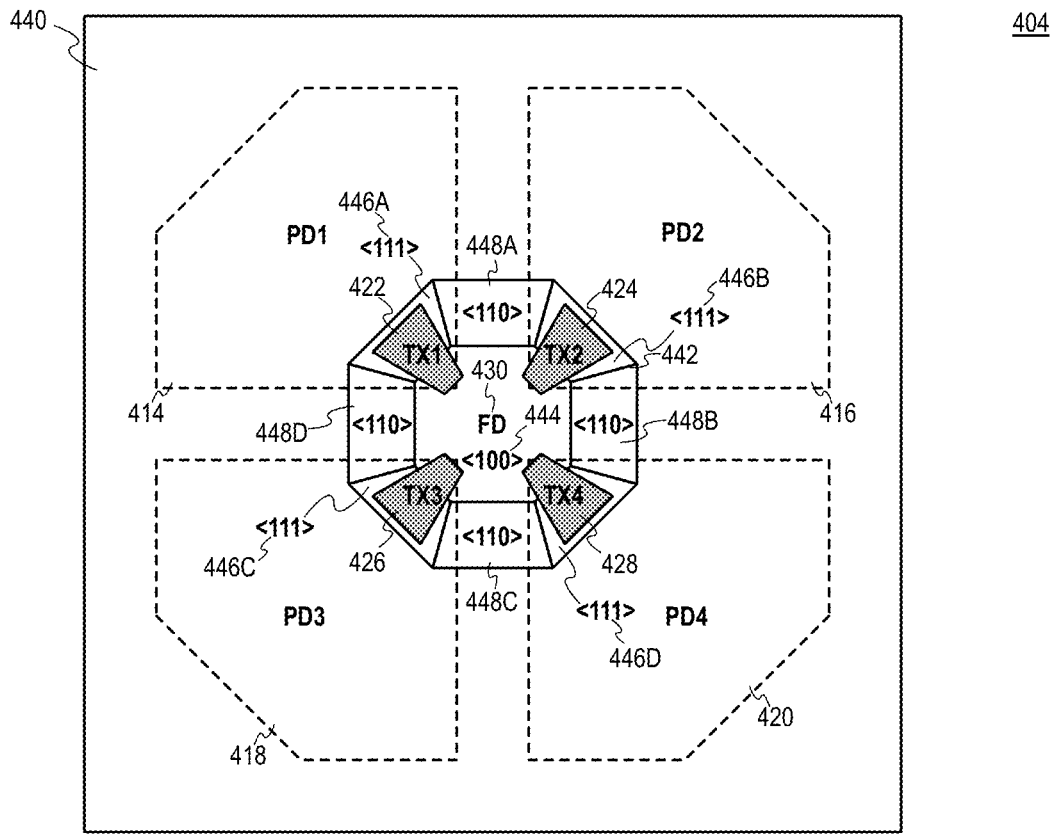
FIG. 4 is a plan view of a portion of another example pixel circuit including example tilted transfer gates disposed over photodiodes and a floating diffusion disposed in a semiconductor substrate in accordance with the teachings of the present invention.

FIG. 4 is a plan view of a portion of another example pixel circuit 404 including example tilted transfer gates disposed over photodiodes and a floating diffusion disposed in a semiconductor substrate in accordance with the teachings of the present invention. It is appreciated that the example of pixel circuit 404 of FIG. 4 may be one example of the pixel circuit 204 of FIG. 2, or of pixel circuits 104 of the pixel array 102 as shown in FIG. 1, and that similarly named and numbered elements described above are coupled and function similarly below.

It is also appreciated that the example pixel circuit 404 of FIG. 4 shares many similarities with the example pixel circuit 304 of FIG. 3. For instance, as shown in the plan view example depicted in FIG. 4, pixel circuit 404 includes a trench 442 etched into a front side surface of a semiconductor substrate 440. In the example, the trench 442 includes a bottom surface 444 etched along a <100> crystalline plane of the semiconductor substrate 440, and a first tilted side surface 446A, a second tilted side surface 446B, a third tilted side surface 446C, and a fourth tilted side surface 446D, etched along respective <111> crystalline planes of the semiconductor substrate 440 that extend between the bottom surface 444 and the front side surface of the semiconductor substrate 440 in accordance with the teachings of the present invention.

One difference between the example pixel circuit 404 of FIG. 4 and the example pixel circuit 304 of FIG. 3 is that the trench 442 of pixel circuit 404 of FIG. 4 also includes a plurality of other side surfaces etched along another crystalline plane of the semiconductor substrate 440. For instance, as shown in the example depicted in FIG. 4, trench 442 also includes a first other side surface 448A etched along a first <110> crystalline plane, a second other side surface 448B etched along a second <110> crystalline plane, a third other side surface 448C etched along a third <110> crystalline plane, and a fourth other side surface 448D etched along a fourth <110> crystalline plane of the semiconductor substrate 440. As shown, each one of the plurality of other side surfaces 448A, 448B, 448C, 448D is disposed between a respective neighboring pair of the plurality of tilted side surfaces 446A, 446B, 446C, 446D of the trench 442. For instance, first other side surface 448A is disposed between first tilted side surface 446A and second tilted side surface 446B. Second other side surface 448B is disposed between second tilted side surface 446B and fourth tilted side surface 446D. Third other side surface 448C is disposed between fourth tilted side surface 446D and third tilted side surface 446C. Fourth other side surface 448D is disposed between third tilted side surface 446C and first tilted side surface 446A.

Similar to the example pixel circuit 304 of FIG. 3, pixel circuit 404 of FIG. 4 includes a floating diffusion FD 430, which is disposed in the semiconductor substrate 440 beneath the bottom surface 444 of the trench 442. As shown in the example, pixel circuit 404 also includes a first photodiode PD1 414 disposed in the semiconductor substrate 440 beneath the first tilted side surface 446A, a second photodiode PD2 416 disposed in the semiconductor substrate 440 beneath the second tilted side surface 446B, a third photodiode PD3 418 disposed in the semiconductor substrate 440 beneath the third tilted side surface 446C, and a fourth photodiode PD4 420 disposed in the semiconductor substrate 440 beneath the fourth tilted side surface 446D. In the example, it is appreciated that the first photodiode PD1 414, second photodiode PD2 416, third photodiode PD3 418, fourth photodiode PD4 420 are all separated from the floating diffusion FD 430 in the semiconductor substrate 440. In operation, the first photodiode PD1 414, second photodiode PD2 416, third photodiode PD3 418, fourth photodiode PD4 420 are configured to photogenerate image charge in response to incident light.

In the various examples, it is appreciated that the floating diffusion FD 430, the first photodiode PD1 414, second photodiode PD2 416, third photodiode PD3 418, fourth photodiode PD4 420 are all disposed in an isolation region of the semiconductor substrate 440. The isolation region provides electrical isolation between adjacent photodiodes. In one example, the semiconductor substrate 440 is a silicon substrate and the isolation region is formed in the silicon substrate as a P-well isolation implanted with P-type dopants (e.g., boron) having an opposite conductivity type than dopants (e.g., phosphorus, arsenic) that are implanted to form the photodiodes and floating diffusion FD 430. In one example, the isolation region includes a shallow well and a deep well wherein the deep well extended from shallow well therein between adjacent photodiodes. In one example, isolation region is an epitaxial layer (e.g., in-situ P-type doped epitaxial layer) grown on the semiconductor substrate 440. In one example, the photodiode regions of the first photodiode PD1 414, second photodiode PD2 416, third photodiode PD3 418, fourth photodiode PD4 420 are all fabricated using photolithography and implantation to form shallow N-type photodiode regions (NPPD) and deep N-type photodiode regions (DNPPD).

Continuing with the depicted example, a first tilted transfer gate 422 is disposed over at least a portion of the bottom surface 444 of the trench 442 and at least a portion of the first tilted side surface 446A of the trench 442. A second tilted transfer gate 424 is disposed over at least a portion of the bottom surface 444 of the trench 442 and at least a portion of the second tilted side surface 446B of the trench 442. A third tilted transfer gate 426 is disposed over at least a portion of the bottom surface 444 of the trench 442 and at least a portion of the third tilted side surface 446C of the trench 442. A fourth tilted transfer gate 428 is disposed over at least a portion of the bottom surface 444 of the trench 442 and at least a portion of the fourth tilted side surface 446D of the trench 442. In one example, the first tilted transfer gate 422, the second tilted transfer gate 424, the third tilted transfer gate 426, and the fourth tilted transfer gate 428 are formed with polysilicon. In operation, the first tilted transfer gate 422, the second tilted transfer gate 424, the third tilted transfer gate 426, and the fourth tilted transfer gate 422 are configured to transfer the image charge from first photodiode PD1 414, second photodiode PD2 416, third photodiode PD3 418, and fourth photodiode PD4 420 to the floating diffusion FD 430 in response to gate transfer signals TX1, TX2, TX3, and TX4, respectively.

Another difference between the example depicted in FIG. 4 and the example depicted in FIG. 3 is that in the example depicted in FIG. 4, the layout of trench layout 442 is an eight-sided polygon, with four edges that are parallel to the respective <110> crystalline planes and four edges that are parallel to the respective <111> crystalline planes of the semiconductor substrate 440. During fabrication, the etching rate for the <100> crystalline plane is higher than the etching rate for the <110> crystalline plane, and the etching rate for the <110> crystalline plane is higher than the etching rate for the <111> crystalline plane, which form corresponding slopes in the included planes of the side surfaces of trench 442. In addition, since the layout of trench 442 is symmetrical across the four photodiodes including first photodiode PD1 414, second photodiode PD2 416, third photodiode PD3 418, and fourth photodiode PD4 420, the structure of trench 442 is also symmetrical.

Figure 5:
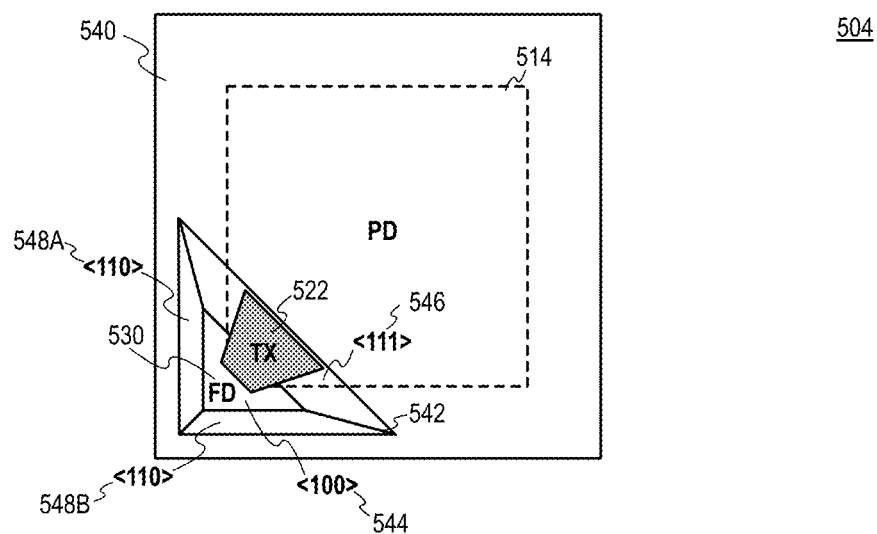
FIG. 5 is a plan view of a portion of an example pixel circuit including an example tilted transfer gate disposed over a photodiode and a floating diffusion disposed in a semiconductor substrate in accordance with the teachings of the present invention.

FIG. 5 is a plan view of a portion of an example pixel circuit 504 including an example tilted transfer gate disposed over a single photodiode and a floating diffusion disposed in a semiconductor substrate in accordance with the teachings of the present invention. It is appreciated that the example pixel circuit 504 of FIG. 5 may be another example of the pixel circuit 204 of FIG. 2 with a single photodiode, or of pixel circuits 104 of the pixel array 102 as shown in FIG. 1, and that similarly named and numbered elements described above are coupled and function similarly below.

It is also appreciated that the example pixel circuit 504 of FIG. 5 shares many similarities with the example pixel circuit 404 of FIG. 4 or the example pixel circuit 304 of FIG. 3. However, one difference is that the example pixel circuit 504 of FIG. 5 illustrates a single photodiode example instead of a four photodiode example as shown in FIG. 4 or in FIG. 3. As shown in the example depicted in FIG. 5, pixel circuit 504 includes a trench 542 etched into a front side surface of a semiconductor substrate 540. In the example, the trench 542 includes a bottom surface 544 etched along a <100> crystalline plane of the semiconductor substrate 540, a tilted side surface 546 etched along a <111> crystalline plane of semiconductor substrate 540, a first other side surface 548A etched along a <110> crystalline plane of semiconductor substrate 540, and a second other side surface 548B etched along another <110> crystalline plane of semiconductor substrate. In the example, the tilted side surface 546, the first other side surface 548A, and the second other side surface 548B extend between the bottom surface 544 and the front side surface of the semiconductor substrate 540 in accordance with the teachings of the present invention.

Similar to the example pixel circuit 404 of FIG. 4 and pixel circuit 304 of FIG. 3, pixel circuit 504 of FIG. 5 includes a floating diffusion FD 530, which is disposed in the semiconductor substrate 540 beneath the bottom surface 544 of the trench 542. As shown in the example, pixel circuit 504 also includes a single photodiode PD 514 disposed in the semiconductor substrate 540 beneath the tilted side surface 546. In one example, the photodiode PD 514 has a width of approximately 1.4 µm. In the example, it is appreciated that the photodiode PD 514 is separated from the floating diffusion FD 530 in the semiconductor substrate 540. In operation, the photodiode PD 514 is configured to photogenerate image charge in response to incident light.

In the depicted examples, it is appreciated that the floating diffusion FD 530 and the photodiode PD 514 are all disposed in an isolation region of the semiconductor substrate 540. In one example, the semiconductor substrate 540 is a silicon substrate and the isolation region is formed in the silicon substrate as a P-well isolation implanted with P-type dopants, e.g., boron, having an opposite conductivity type than photodiode PD 514 and floating diffusion FD 530. In one example, the isolation region includes a shallow well and a deep well implanted therein between adjacent photodiodes. In one example, the isolation region is an epitaxial layer grown on the semiconductor substrate 540. In one example, the photodiode region of the photodiode PD 514 is fabricated using photolithography and implantation to form a shallow N-type photodiode region (NPPD) and a deep N-type photodiode region (DNPPD).

Continuing with the depicted example, the tilted transfer gate 522 is disposed over at least a portion of the bottom surface 544 of the trench 542 and at least a portion of the tilted side surface 546 of the trench 542. In one example, tilted transfer gate 522 is formed with polysilicon. In operation, the tilted transfer gate 522 is configured to transfer the image charge from photodiode PD 514 to the floating diffusion FD 530 in response to a gate transfer signal TX.

Another difference between the example depicted in FIG. 5 and the examples depicted in FIG. 4 and FIG. 3 is that in the example depicted in FIG. 5, the layout of trench layout 542 is a three-sided polygon or a triangle, with two edges that are parallel to the respective <110> crystalline planes and one edge that is parallel to the respective <111> crystalline plane of the semiconductor substrate 540. During fabrication, the etching rate for the <100> crystalline plane is higher than the etching rate for the <110> crystalline plane, and the etching rate for the <110> crystalline plane is higher than the etching rate for the <111> crystalline plane, which therefore form the corresponding slopes in the included planes of the side surfaces of trench 542.

Figure 6A:
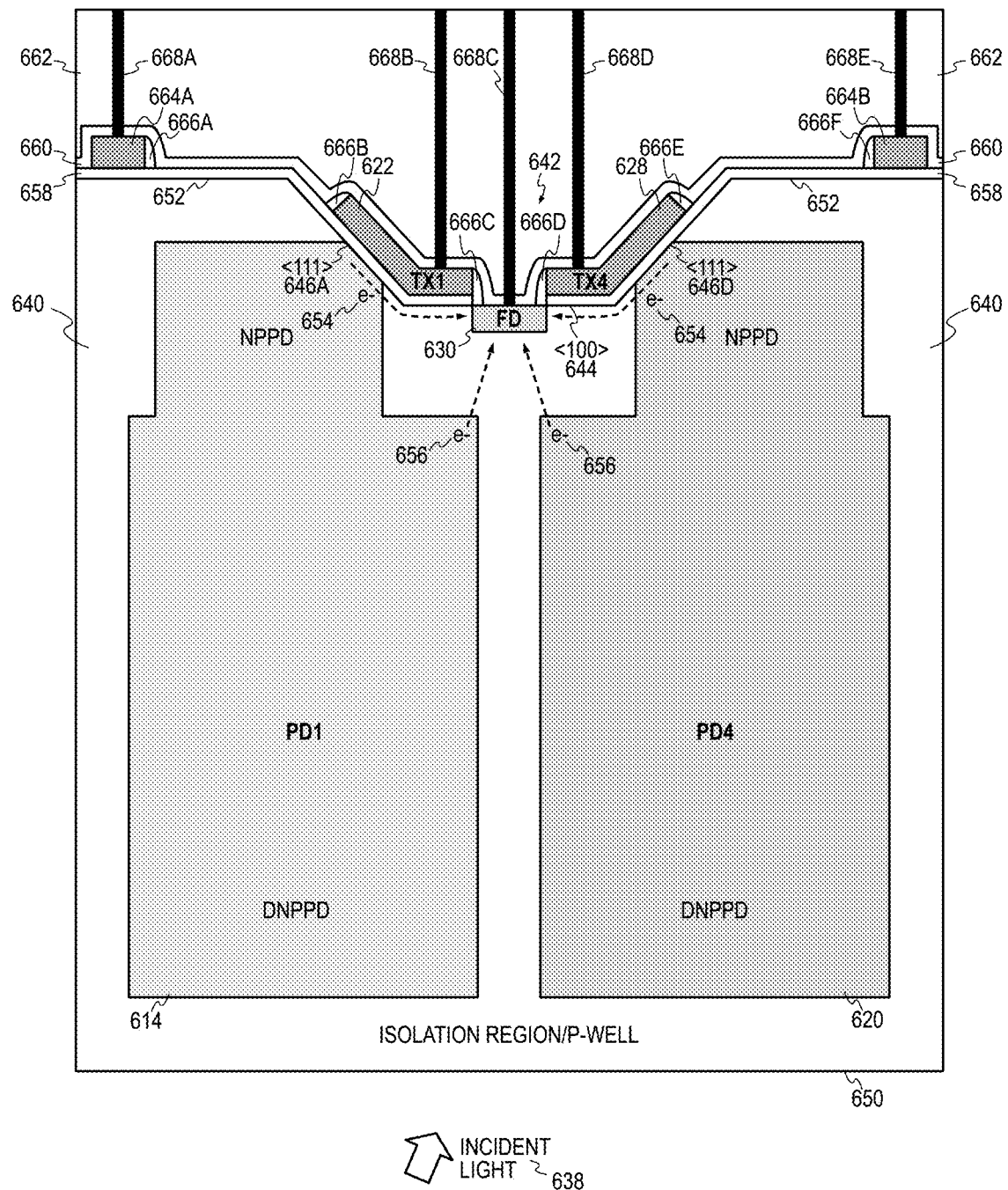
FIG. 6A is a cross-section view of a portion of an example pixel circuit including example tilted transfer gates disposed over photodiodes and a floating diffusion disposed in a semiconductor substrate in accordance with the teachings of the present invention.

FIG. 6A is a cross-section view of a portion of an example pixel circuit 604A including example tilted transfer gates disposed over photodiodes and a floating diffusion disposed in a semiconductor substrate in accordance with the teachings of the present invention. It is appreciated that the example pixel circuit 604A of FIG. 6A may be a cross-section view of example pixel circuit 304 of FIG. 3 along dashed line A-A', or of example pixel circuit 404 of FIG. 4, or of example pixel circuit 204 of FIG. 2, or of pixel circuits 104 of the pixel array 102 as shown in FIG. 1, and that similarly named and numbered elements described above are coupled and function similarly below.

As shown in the cross-section view example depicted in FIG. 6A, pixel circuit 604A includes a trench 642 etched into a front side surface 652 of a semiconductor substrate 640. In the illustrated example, the trench 642 includes a bottom surface 644 etched along a <100> crystalline plane of the semiconductor substrate 640, and a first tilted side surface 646A and a fourth tilted side surface 646D etched along respective <111> crystalline planes of the semiconductor substrate 640 that extend between the bottom surface 644 and the front side surface 652 of the semiconductor substrate 640 in accordance with the teachings of the present invention. In the depicted example, it is appreciated that a second tilted side surface and a fourth tilted side surface are also included in trench 642, but are not visible in the cross-section view of FIG. 6A.

The depicted example also illustrates that pixel circuit 604A includes a floating diffusion FD 630, which is disposed in the semiconductor substrate 640 beneath the bottom surface 644 of the trench 642. As shown in the example, pixel circuit 604A also includes a first photodiode PD1 614 disposed in the semiconductor substrate 640 beneath the first tilted side surface 646A and a fourth photodiode PD4 620 disposed in the semiconductor substrate 640 beneath the fourth tilted side surface 646D. In the depicted example, it is appreciated that a second photodiode PD2 and a fourth photodiode PD4 are also disposed in the semiconductor substrate 640, but are not visible in the cross-section view of FIG. 6A.

In the depicted example, it is appreciated that the photodiodes, including first photodiode PD1 614 and fourth photodiode PD4 620, are all separated from the floating diffusion FD 630 in the semiconductor substrate 640, for example by an isolation region. In operation, the photodiodes, including first photodiode PD1 614 and fourth photodiode PD4 620, are configured to photogenerate image charge in response to incident light 638, which is directed through a backside 650 of semiconductor substrate to first photodiode PD1 614 and fourth photodiode PD4 620 as shown.

In the various examples, it is appreciated that the floating diffusion FD 630 and the photodiodes, including first photodiode PD1 614 and fourth photodiode PD4 620, are all disposed in an isolation region of the semiconductor substrate 640. In one example, the semiconductor substrate 640 is a silicon substrate and the isolation region is formed in the silicon substrate as a P-well isolation formed of a shallow/deep P-type well. In one example, P-well isolation is formed by implanted P-type dopants, e.g., boron, having an opposite conductivity type than dopants that are implanted to form photodiodes PD1 614, PD4 620 and floating diffusion FD 630. In one example, the isolation region includes a shallow well and a deep well implanted therein between adjacent photodiodes, for example between photodiodes PD1 614 and its adjacent photodiodes. In one example, the isolation region is an epitaxial layer grown on the semiconductor substrate 640. In one example, the photodiode regions of the photodiodes, including first photodiode PD1 614 and fourth photodiode PD4 620 are fabricated using photolithography and implantation to form shallow N-type photodiode regions (NPPD) and deep N-type photodiode regions (DNPPD) as shown.

Continuing with the cross-section view of example pixel circuit 604A, a gate oxide layer 658 is formed over the front side surface 652, the bottom surface 644, and the tilted side surfaces 646A and 646D of trench 642 conformally as shown in FIG. 6A. In the example, a plurality of gate structures are formed over the gate oxide layer 658. In the example shown in FIG. 6A, the plurality of gate structures includes gate structures 664A and 664B, which are gates for other pixel transistors, e.g., source follower, reset transistor, formed over the gate oxide layer 658 and over the front side surface 652 of the semiconductor substrate 640. In addition, the plurality of gate structures include a first tilted transfer gate 622 disposed over the gate oxide layer 658 and at least a portion of the bottom surface 644 of the trench 642 and at least a portion of the first tilted side surface 646A of the trench 642. In addition, a fourth tilted transfer gate 628 is disposed over at least a portion of the bottom surface 644 of the trench 642 and at least a portion of the fourth tilted side surface 646D of the trench 642. In one example, the plurality of gate structures are formed with polysilicon, or another suitable gate structure material. As shown in the depicted example, the first tilted transfer gate 622 and the fourth tilted transfer gate 628 are disposed over portions of the bottom surface 644 and extend from the bottom surface 644 partially up the lower portions of the tilted side surfaces 646A and 646D of the trench 642.

As shown in FIG. 6A, during operation, the first tilted transfer gate 622 and fourth tilted transfer gate 628 are configured to transfer the image charge e– 654 from the first photodiode PD1 614 and fourth photodiode PD4 620 through the charge transfer paths as shown under the gate oxide layer 658 to the floating diffusion 630 in response to gate transfer signals TX1 and TX4, respectively. The example depicted in FIG. 6A also shows that the blooming or charge leakage path for electrons e– 656 from the deep N-type photodiode regions (DNPPD) of the first photodiode PD1 614 and fourth photodiode PD4 620 through the semiconductor substrate 640 to the floating diffusion FD 630 are separate and non-overlapping paths. Blooming or charge leakage paths are paths for excess photogenerated electrons (e.g., image charge 656) to travel from respective photodiodes PD1 614 or PD4 620 to the floating diffusion FD 630 during integration when respective first tilted transfer gate 622 and fourth tilted transfer gate 622 are turned off. As shown, the blooming or charge leakage paths and charge transfer paths are separate and non-overlapping paths. Hence, there is no need to make performance trade-offs between blooming and charge transfer, e.g., increasing the concentration of a blooming implant to achieve required blooming performance, which may result in dark current and white pixels, while tuning a passivation implant to address dark current and white pixels, which could impede charge transfer and degrade blooming.

In one example, the blooming or charge leakage path can be adjusted by the distance length of this path, which is the distance between the floating diffusion FD 630 and the photodiode regions of first photodiode PD1 614 and second photodiode PD4 620. In one example, the charge leakage path of image charge e– 656 from the photodiodes PD1 614 and PD4 620 through the semiconductor substrate 640 to the floating diffusion FD 630 has a length of approximately 1600 to 3600 angstroms through the semiconductor substrate 640.

Continuing with the example depicted in FIG. 6A, a plurality of spacers 666A, 666B, 666C, 666D, 666E, 666F are formed proximate to the plurality of gate structures 664A, 622, 628, 664B as shown. A contact etch stop layer 660 is disposed over the plurality of gate structures 664A, 622, 628, 664B, the plurality of spacers 666A, 666B, 666C, 666D, 666E, 666F, the front side surface 652, and the trench 642 etched into the front side surface 652 of the semiconductor substrate 640. In one example, the contact etch stop layer is formed with a SiN film with a thickness of approximately 3-400 angstroms.

As shown in the illustrated example, an interlayer dielectric 662 is disposed over the contact etch stop layer 660. A plurality of contacts are formed in the interlayer dielectric 662. In the example, the plurality of contacts include a plurality of front side gate structure contacts 668A, 668E, which are coupled through the interlayer dielectric 662 to gate structures 664A, 664B, which are disposed over gate oxide layer 658 on the front side surface 652. In addition, the plurality of contacts include a floating diffusion contact 668C, which is coupled through the interlayer dielectric 662 to the floating diffusion FD 630.

The example depicted in FIG. 6A also shows that the plurality of contacts further includes a first tilted transfer gate contact 668B coupled through the interlayer dielectric 662 to a portion of the first tilted transfer gate 622 that is disposed over a portion of the bottom surface 644 of the trench 642. The plurality of contacts also includes a fourth tilted transfer gate contact 668D coupled through the interlayer dielectric 662 to a portion of the fourth tilted transfer gate 628 that is disposed over a portion of the bottom surface 644 of the trench 642. In various examples, the first tilted transfer gate 622 and the fourth tilted transfer gate 628 have a transfer gate length of approximately 0.25-0.3 μm. In the various examples, the plurality of contacts 668A, 668B, 668C, 668D, 668E have a critical dimension thickness of approximately 0.08 μm and are separated from each other by a distance of at least 0.1 μm. It is appreciated of course that the example critical dimensions of these thicknesses and spacing distances of the plurality of contacts 668A, 668B, 668C, 668D, 668E are provided for explanation purposes, and that in other examples, the critical dimensions of the thickness and spacing distances may be different and may be determined by process design rules that are not necessarily limited to the illustrated example.

Figure 6B:
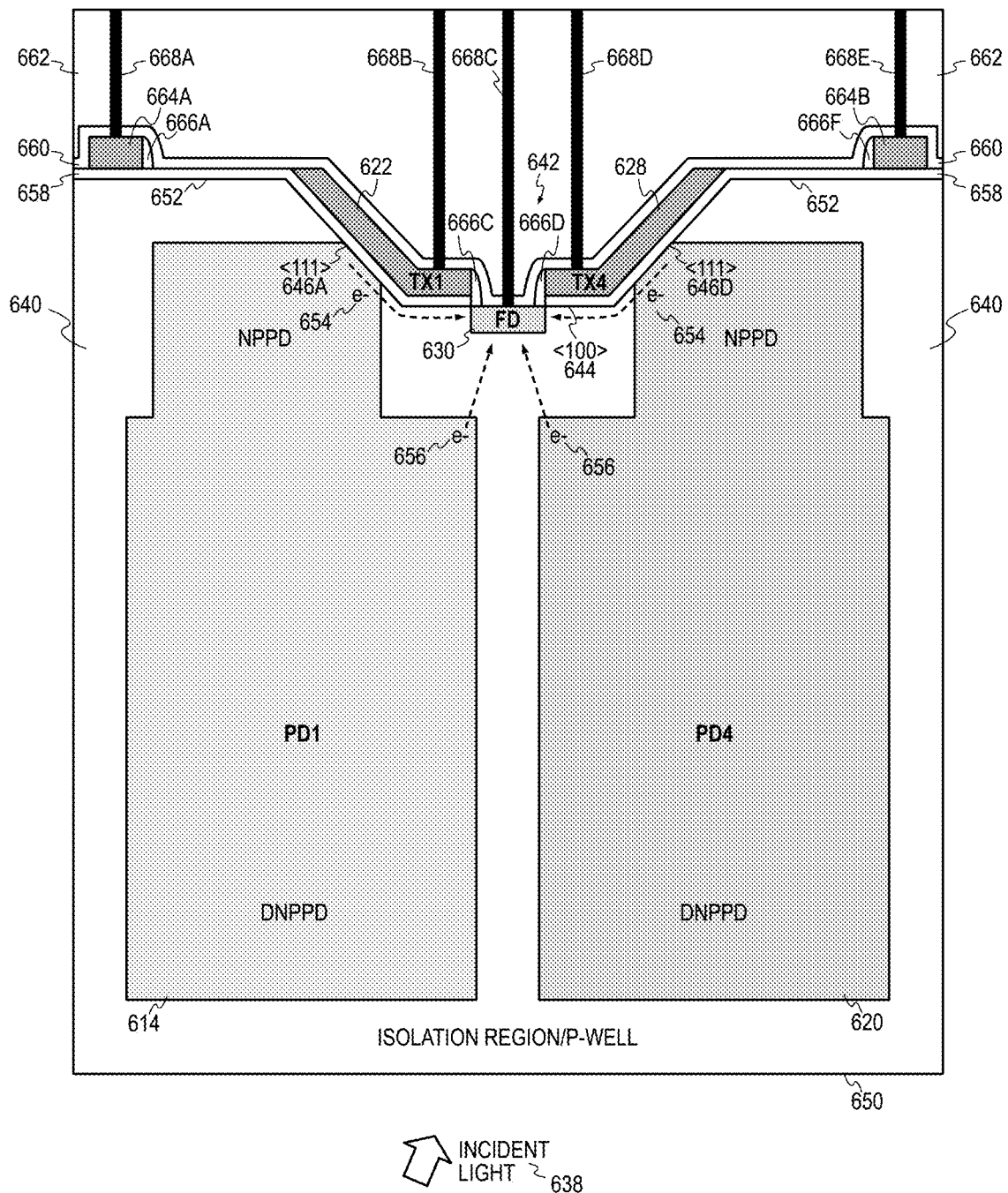
FIG. 6B is a cross-section view of a portion of another example pixel circuit including example tilted transfer gates disposed over photodiodes and a floating diffusion disposed in a semiconductor substrate in accordance with the teachings of the present invention.

FIG. 6B is a cross-section view of a portion of another example a pixel circuit 604B including example tilted transfer gates disposed over photodiodes and a floating diffusion disposed in a semiconductor substrate in accordance with the teachings of the present invention. It is appreciated that the example pixel circuit 604B of FIG. 6B is substantially similar to the example pixel circuit 604A of FIG. 6A, and may therefore be a cross-section view of example pixel circuit 304 of FIG. 3 along dashed line A-A', or of example pixel circuit 404 of FIG. 4, or of example pixel circuit 204 of FIG. 2, or of pixel circuits 104 of the pixel array 102 as shown in FIG. 1, and that similarly named and numbered elements described above are coupled and function similarly below.

One difference between the example pixel circuit 604B of FIG. 6B and the example pixel circuit 604A of FIG. 6A is that in the example pixel circuit 604B of FIG. 6B, the first tilted transfer gate 622 and the fourth tilted transfer gate 628 are disposed over portions of the bottom surface 644, extend from the bottom surface 644 up the tilted side surfaces 646A and 646D of the trench 642, and are leveled with the front side surface 652 of the semiconductor substrate 640 as shown. Similar to the example pixel circuit 604A of FIG. 6A, in the example pixel circuit 604B of FIG. 6B, the first tilted transfer gate contact 668B is coupled through the interlayer dielectric 662 to a portion of the first tilted transfer gate 622 that is disposed over a portion of the bottom surface 644 of the trench 642, and the fourth tilted transfer gate contact 668D is coupled through the interlayer dielectric 662 to a portion of the fourth tilted transfer gate 628 that is disposed over a portion of the bottom surface 644 of the trench 642.

Figure 6C:
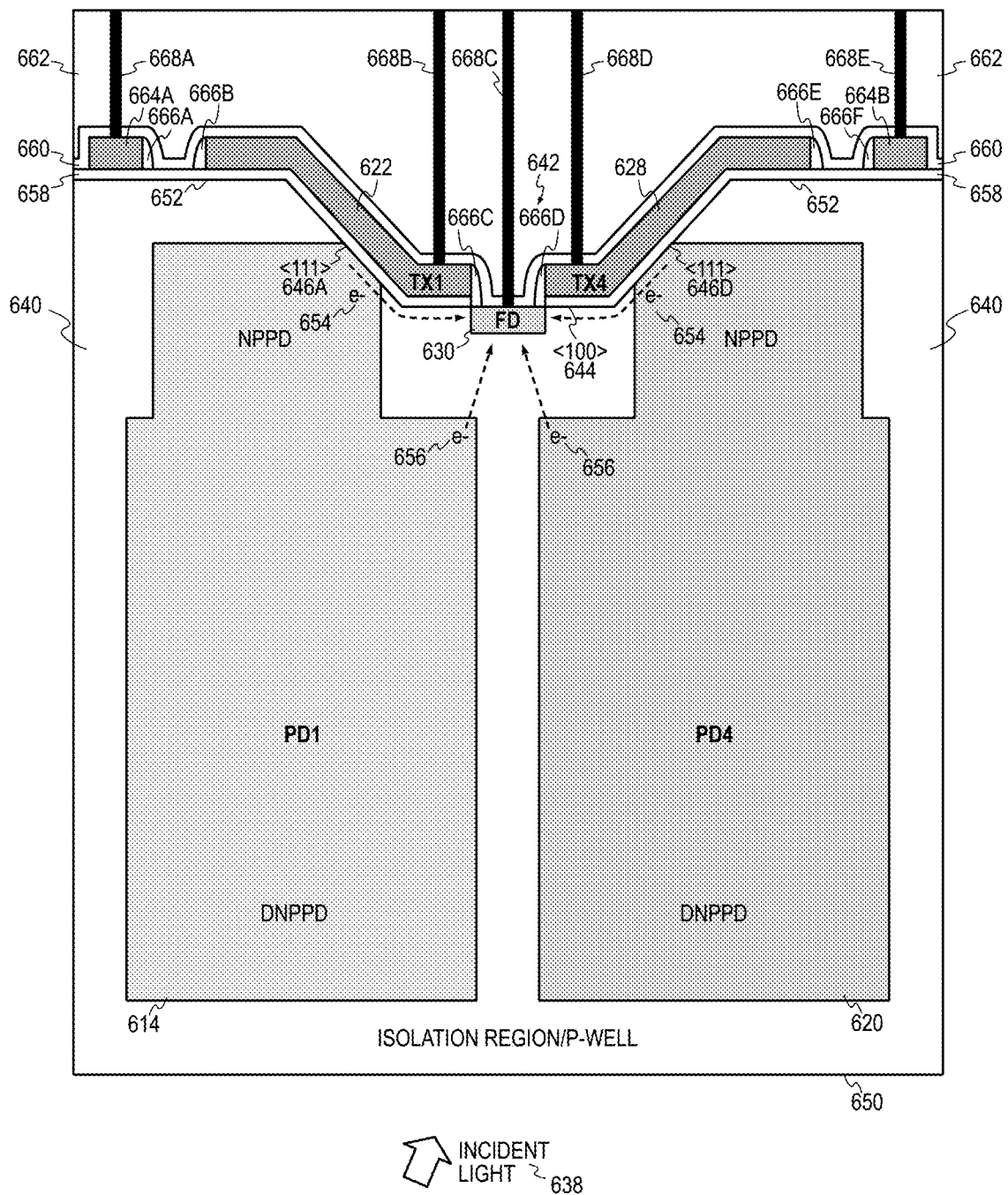
FIG. 6C is a cross-section view of a portion of yet another example pixel circuit including example tilted transfer gates disposed over photodiodes and a floating diffusion disposed in a semiconductor substrate in accordance with the teachings of the present invention.

FIG. 6C is a cross-section view of a portion of yet another example pixel circuit 604C including example tilted transfer gates disposed over photodiodes and a floating diffusion disposed in a semiconductor substrate in accordance with the teachings of the present invention. It is appreciated that the example pixel circuit 604C of FIG. 6C is also substantially similar to the example pixel circuit 604A of FIG. 6A, and may therefore be a cross-section view of example pixel circuit 304 of FIG. 3 along dashed line A-A', or of example pixel circuit 404 of FIG. 4, or of example pixel circuit 204 of FIG. 2, or of pixel circuits 104 of the pixel array 102 as shown in FIG. 1, and that similarly named and numbered elements described above are coupled and function similarly below.

One difference between the example pixel circuit 604C of FIG. 6C and the example pixel circuit 604A of FIG. 6A is that in the example pixel circuit 604C of FIG. 6C, the first tilted transfer gate 622 and the fourth tilted transfer gate 628 are disposed over portions of the bottom surface 644, extend from the bottom surface 644 up the tilted side surfaces 646A and 646D of the trench 642, and further extend over a portion the front side surface 652 of the semiconductor substrate 640 as shown. Similar to the example pixel circuit 604A of FIG. 6A, in the example pixel circuit 604C of FIG. 6C, the first tilted transfer gate contact 668B is coupled through the interlayer dielectric 662 to a portion of the first tilted transfer gate 622 that is disposed over a portion of the bottom surface 644 of the trench 642, and the fourth tilted transfer gate contact 668D is coupled through the interlayer dielectric 662 to a portion of the fourth tilted transfer gate 628 that is disposed over a portion of the bottom surface 644 of the trench 642.

Figure 6D:
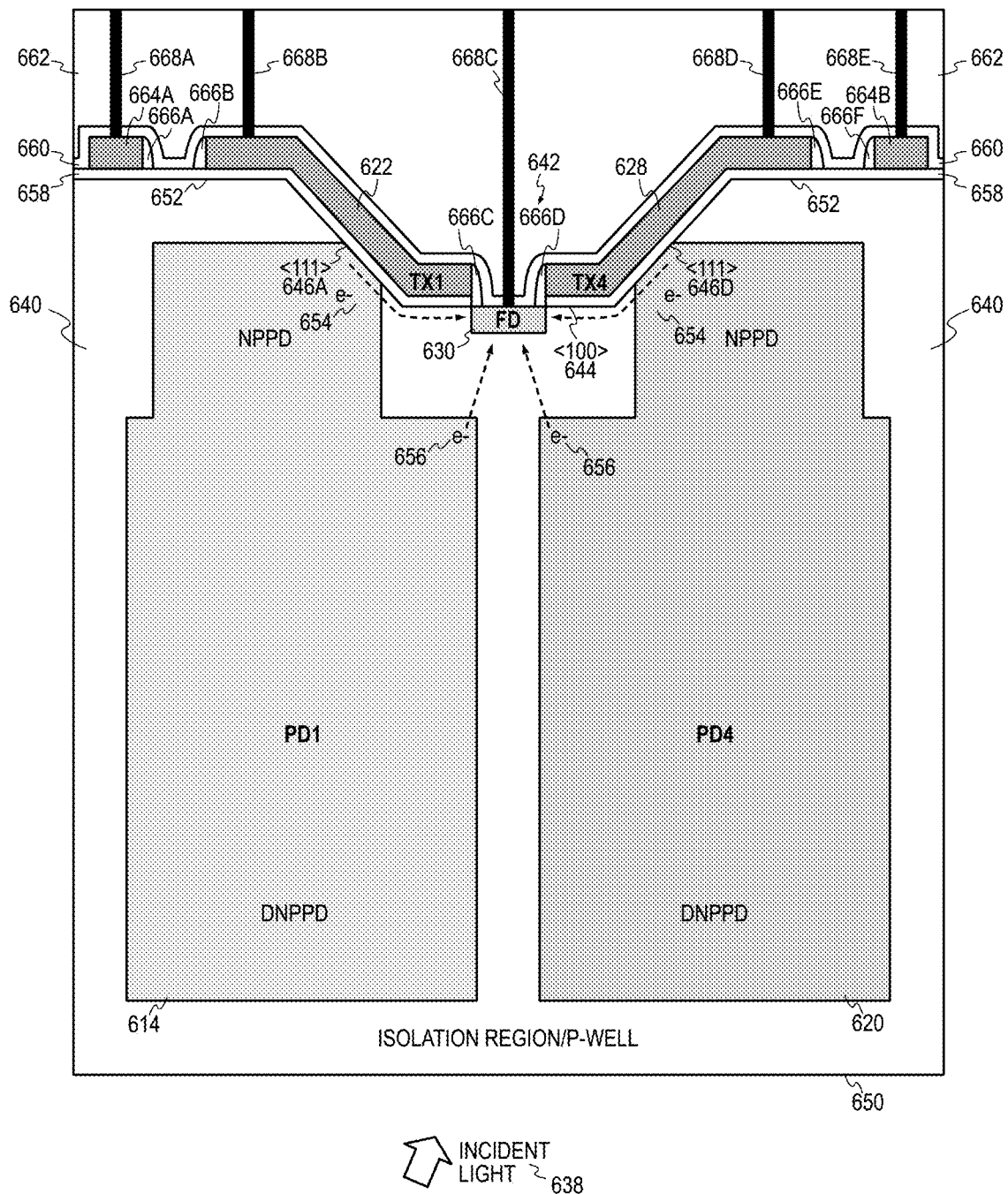
FIG. 6D is a cross-section view of a portion of still another example pixel circuit including example tilted transfer gates disposed over photodiodes and a floating diffusion disposed in a semiconductor substrate in accordance with the teachings of the present invention.

FIG. 6D is a cross-section view of a portion of still another example pixel circuit 604D including example tilted transfer gates disposed over photodiodes and a floating diffusion disposed in a semiconductor substrate in accordance with the teachings of the present invention. It is appreciated that the example pixel circuit 604D of FIG. 6D is substantially similar to the example pixel circuit 604C of FIG. 6C, and may also therefore be a cross-section view of example pixel circuit 304 of FIG. 3 along dashed line A-A', or of example pixel circuit 404 of FIG. 4, or of example pixel circuit 204 of FIG. 2, or of pixel circuits 104 of the pixel array 102 as shown in FIG. 1, and that similarly named and numbered elements described above are coupled and function similarly below.

One difference between the example pixel circuit 604D of FIG. 6D and the example pixel circuit 604C of FIG. 6C is that in the example pixel circuit 604D of FIG. 6D, the first tilted transfer gate contact 668B is coupled through the interlayer dielectric 662 to a portion of the first tilted transfer gate 622 that disposed over a portion of the front side surface 652 of the semiconductor substrate 640, and the fourth tilted transfer gate contact 668D is coupled through the interlayer dielectric 662 to a portion of the fourth tilted transfer gate 628 that disposed over a portion of the front side surface 652 of the semiconductor substrate 640.

Figure 7A:
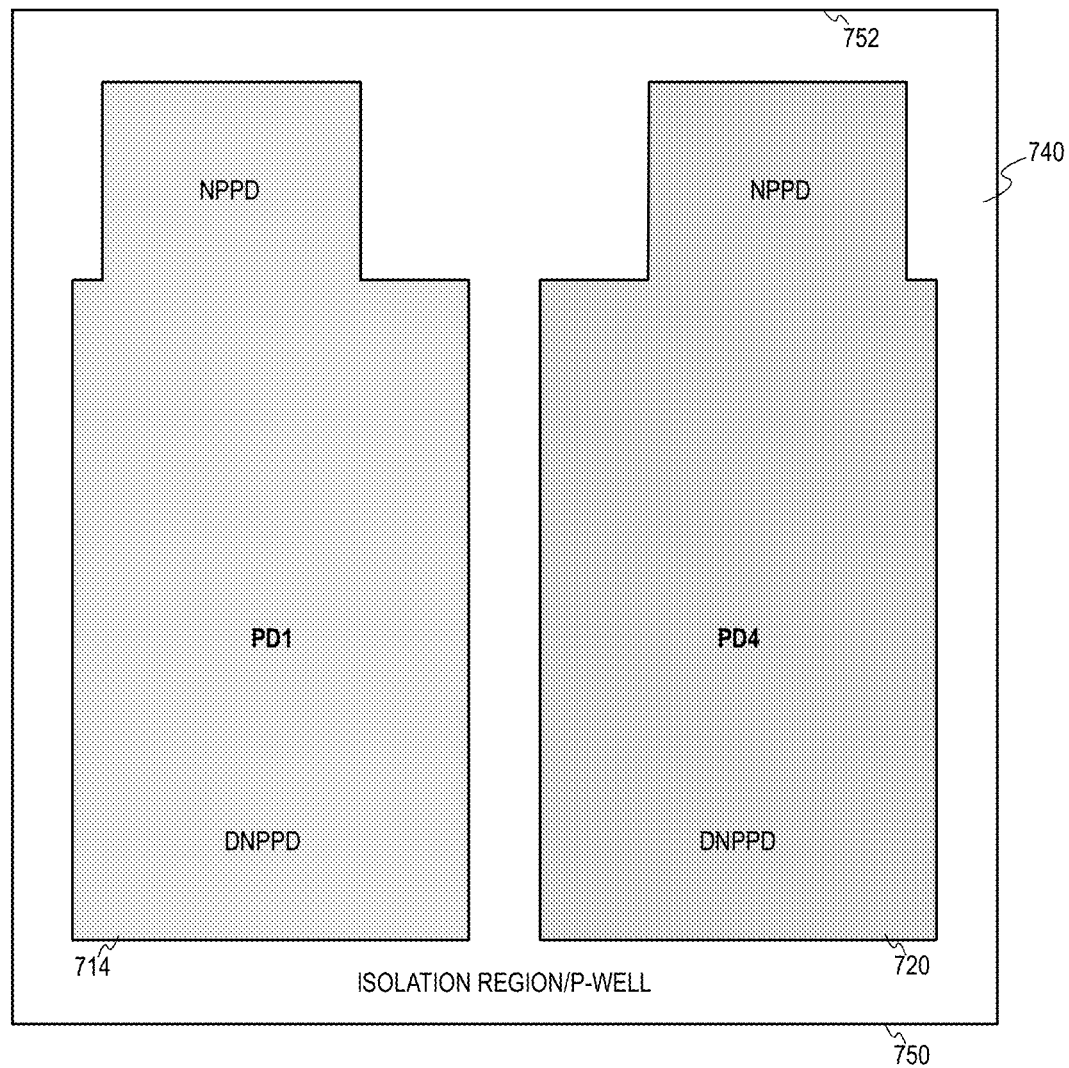
FIGS. 7A-7C are cross-section views of a portion of an example pixel circuit including example tilted transfer gates disposed over photodiodes and a floating diffusion disposed in a semiconductor substrate during various stages of fabrication in accordance with the teachings of the present invention.
Figure 7B:
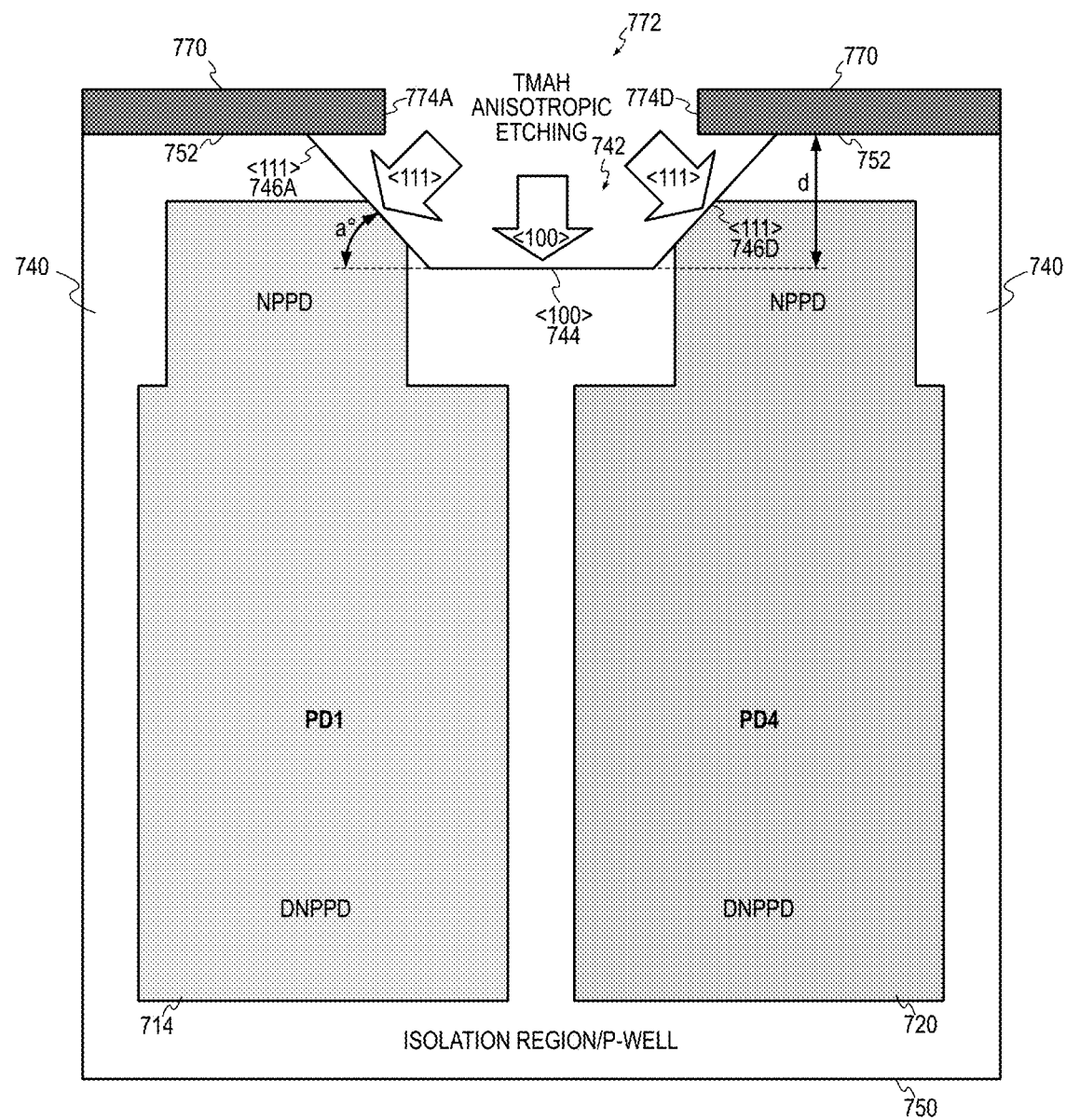
Figure 7C:
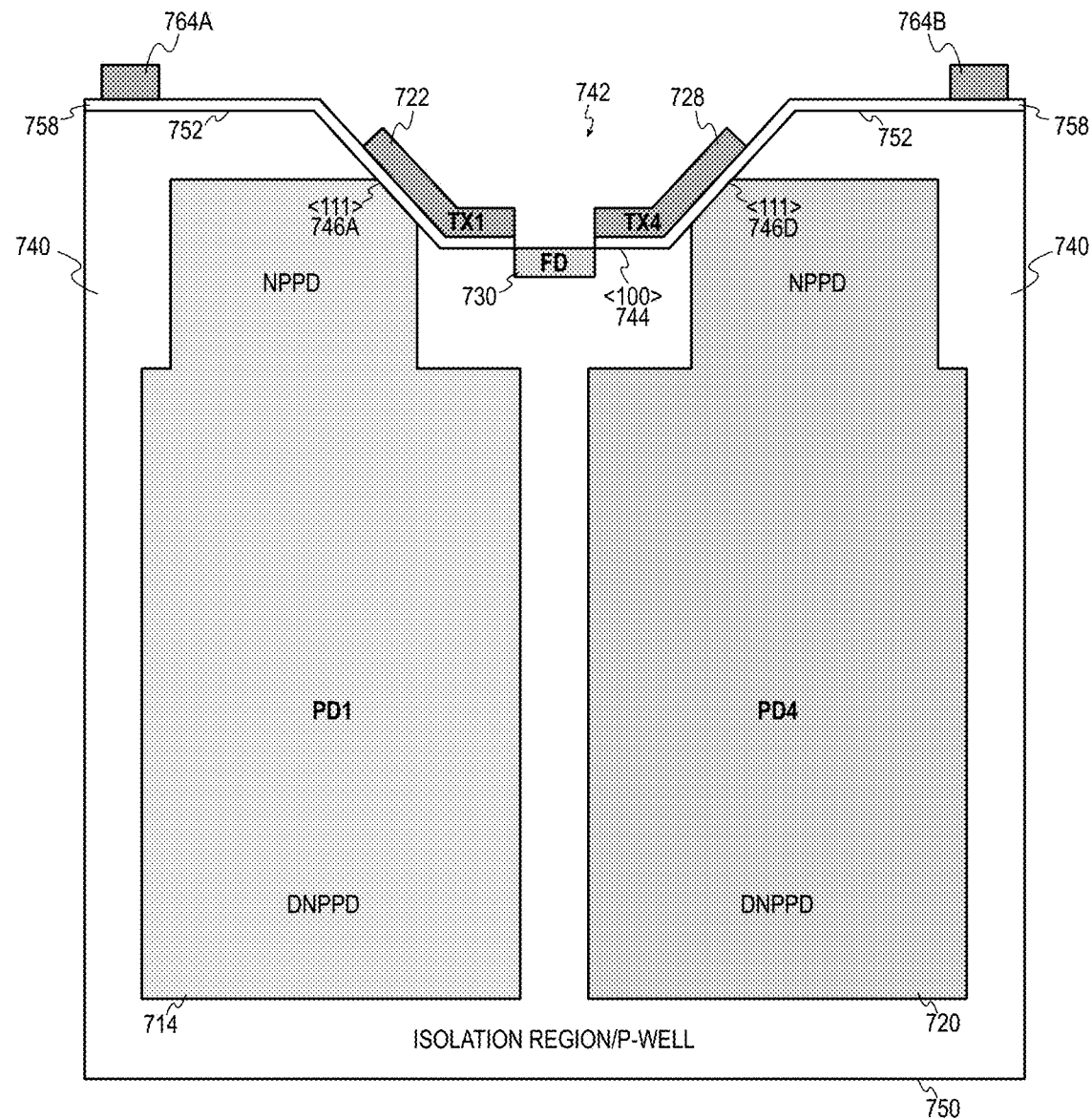

FIGS. 7A-7C are cross-section views of a portion of an example pixel circuit 704 including example tilted transfer gates disposed over photodiodes and a floating diffusion disposed in a semiconductor substrate during various stages of fabrication in accordance with the teachings of the present invention. It is appreciated that the example pixel circuit 704 that is fabricated in FIGS. 7A-7C may be an example of during the fabrication of pixel circuits 604A, 604B, 604C, 604D of FIGS. 6A-6D, or of example pixel circuit 304 of FIG. 3 along dashed line A-A', or of example pixel circuit 404 of FIG. 4, or of example pixel circuit 204 of FIG. 2, or of pixel circuits 104 of the pixel array 102 as shown in FIG. 1, and that similarly named and numbered elements described above are coupled and function similarly below.

FIG. 7A shows a semiconductor substrate 740 of pixel circuit 704 in which an isolation region, such as a P-well, is implanted. In one example, the semiconductor substrate 740 includes silicon, and the P-well may be formed by P-type dopants, e.g., boron, that are implanted into a front side surface 752 of the semiconductor substrate 740. In one example, the P-well may include a shallow region and a deep implanted region, wherein the deep region is implanted at a deeper depth and extended from the shallow region. In another example, the isolation region may be an epitaxial layer (e.g., in-situ P-type doped epitaxial layer) grown on the semiconductor substrate 740. In the example, a first photodiode PD1 714 and a fourth photodiode PD4 720 are implanted beneath front side surface 752 of semiconductor substrate 740 into the isolation region of semiconductor substrate 740. In one example, the photolithography and implantation of N-type dopants (e.g., phosphorus, arsenic) may be used to form shallow N-type photodiode regions (NPPD) and deep N-type photodiode regions (DNNPD) of first photodiode PD1 714 and fourth photodiode PD4 720 as shown. In one example, the shallow portions of first photodiode PD1 714 and fourth photodiode PD4 720 are implanted sufficiently below the front side surface 752 of semiconductor substrate so as to reduce dark current/white pixels induced by surface defects. In the example, the first photodiode PD1 714 and fourth photodiode PD4 720 are configured to be illuminated through a backside 750 of the semiconductor substrate 740.

FIG. 7B shows pixel circuit 704 with a hard mask layer 770 deposited over the front side surface 752 of the semiconductor substrate 740. In the example, the hard mask layer 770 patterned to include a polygon shaped opening 772 including sides or edges 774A, 774D that are parallel to <111> crystalline planes of the semiconductor substrate 740. In one example, the hard mask layer 770 is formed with silicon nitride.

After the hard mask layer 770 is deposited, anisotropic etching is performed on the front side surface 752 semiconductor substrate 740 through the opening 772 with an etching agent of Tetramethylammonium hydroxide (TMAH) to form a trench 742. In the various examples, the anisotropic etching can be performed by all wet etching or a combination of dry and wet etching. As shown in the depicted example, the trench 742 includes a bottom surface 744 etched along a <100> crystalline plane of the semiconductor substrate 740 and tilted side surfaces 746A, 746D, which are etched along respective <111> crystalline planes of the semiconductor substrate 740 and extend between the bottom surface 744 and the front side surface 752. In the example, the first photodiode PD1 714 is disposed in the semiconductor substrate 740 beneath the first tilted side surface 746A and the fourth photodiode PD4 720 is disposed in the semiconductor substrate 740 beneath the fourth tilted side surface 746D of the trench 742.

It is appreciated that TMAH anisotropic etching has a high etching rate along the <100> crystalline plane and the lowest etching rate along the <111> crystalline plane. The etching rate along the <110> crystalline plane is between the high etching rate along the <100> crystalline plane and the low etching rate along the <111> crystalline plane. Due to the differences in the etching rates between the <100>, <111>, and <110> crystalline planes, a slope of an inclined plane formed with the tilted side surfaces 746A, 746D along the respective <111> crystalline planes of the semiconductor substrate 740 relative to the bottom surface 744 along the <100> crystalline plane of the semiconductor substrate is formed with an angle a° equal to 54.74 degrees, or approximately 55 degrees. In the various examples, the angle a° of the tilted side surfaces 746A, 746D along the respective <111> crystalline planes is determined by the atom lattice of the semiconductor substrate 740. In one example, the bottom surface 744 is etched down to a depth of d of approximately 2000-3000 angstroms.

FIG. 7C shows that after the trench 742 has been etched into the front side surface 752, the hard mask layer 770 is removed and that a gate oxide layer 758 is formed over the front side surface 752 and lining the trench 742, including the bottom surface 744 and the tilted side surfaces 746A, 746D of the trench 742. A plurality of gate structures are then formed over the gate oxide layer 758 over the front side surface 752 and the trench 742 as shown, for example by polysilicon deposition followed by photolithography and an etching process. For instance, FIG. 7C shows that the plurality of gate structures include a first tilted transfer gate 722 formed over the gate oxide layer 758, over at least a portion of the bottom surface 744 of the trench 742, and over at least a portion of the tilted side surface 746A of the trench 742. In addition, a fourth tilted transfer gate 728 is formed over the gate oxide layer 758, over at least a portion of the bottom surface 744 of the trench 742, and over at least a portion of the tilted side surface 746D of the trench 742. Further, gate structures 764A and 764B are formed over the gate oxide layer 758 over the front side surface 752 of semiconductor substrate 740 as shown.

In the various examples, it is appreciated that FIGS. 6A-6D illustrate the subsequent processing steps to fabricate a pixel circuit in accordance with the teachings of the present invention. For instance, as summarized detail above, FIGS. 6A-6D show that a contact etch stop layer 660 is then deposited over the plurality of gate structures 622, 628, 664A, 664B, and that an interlayer dielectric 662 is then formed over the contact etch stop layer 660. A plurality of contacts, including contacts 668A, 668B, 668C, 668D, 668E are then formed. The contacts are coupled to the plurality of gate structures gate structures 622, 628, 664A, 664B, and to the floating diffusion FD 630 through the interlayer dielectric 662.

Figure 8:
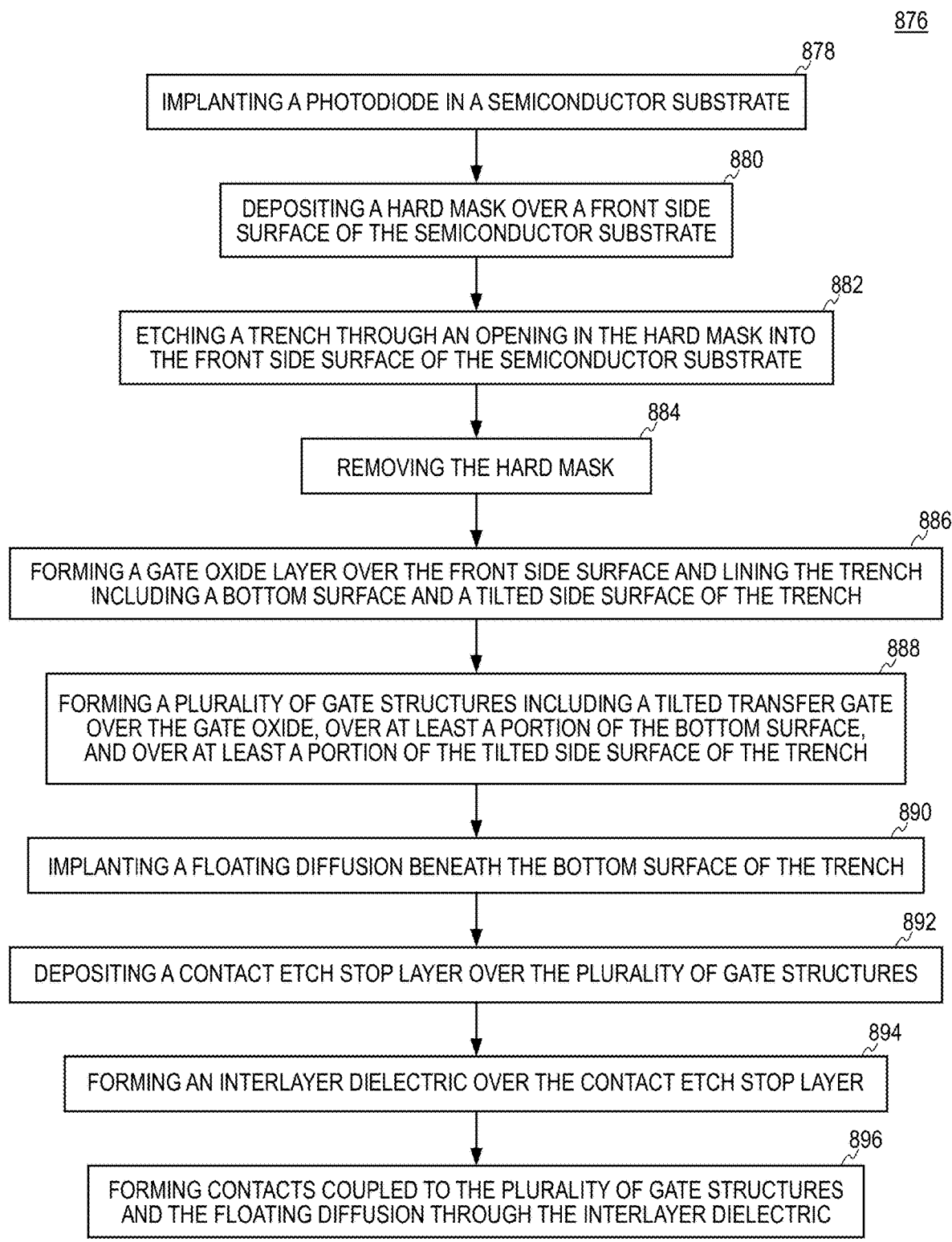
FIG. 8 is a flow diagram illustrating an example process to fabricate a pixel circuit that utilizes an example tilted transfer gate in accordance with the teachings of the present invention.

FIG. 8 is a flow diagram illustrating an example process 876 to fabricate a pixel circuit that utilizes an example tilted transfer gate in accordance with the teachings of the present invention. It is appreciated that an example pixel circuit fabricated with process 876 may be an example of the pixel circuit 704 of FIGS. 7A-7C, pixel circuits 604A, 604B, 604C, 604D of FIGS. 6A-6D, pixel circuit 504 of FIG. 5, pixel circuit 404 of FIG. 4, pixel circuit 304 of FIG. 3, pixel circuit 204 of FIG. 2, or of one of the pixel circuits 104 of pixel array 102 of FIG. 1.

As shown in process 876 of FIG. 8, processing begins at process block 878 where a photodiode is implanted into a semiconductor substrate. In one example, the photodiode is implanted into an isolation region in the semiconductor substrate.

Process block 880 shows that a hard mask layer is then deposited over a front side surface of the semiconductor substrate. In the example, the hard mask layer is patterned to include an opening having a side or edge that is parallel to a <111> crystalline plane of the semiconductor substrate, as discussed above.

Process block 882 shows that a trench is then etched through the opening in the hard mask into the front side surface of the semiconductor substrate. In the various examples, the trench is etched to include a bottom surface and at least one tilted side surface that extends from the bottom surface to the front side surface of the semiconductor substrate.

Process block 884 shows that after the trench is etched, the hard mask layer is removed.

Process block 886 shows that a gate oxide layer is then formed over the front side surface and lining the trench including a bottom surface and a tilted side surface of the trench. In one example, the photodiode is disposed in the semiconductor substrate beneath the tilted side surface of the trench.

Process block 888 shows that a plurality of gate structures are formed including at least a tilted transfer gate over the gate oxide, over at least a portion of the bottom surface, and over at least a portion of the tilted side surface of the trench.

Process block 890 shows that a floating diffusion is then implanted into the semiconductor substrate beneath the bottom surface of the trench. In one example, the floating diffusion may be formed by implantation with alignment made to the tilted transfer gate, e.g., implanted with respect to an edge of the tilted transfer gate.

Process block 892 shows that a contact etch stop layer is then formed over the plurality of gate structures, as well as the front side surface and the trench.

Process block 894 shows that an interlayer dielectric is formed over the contact etch stop layer.

Process block 896 shows that contacts are formed, which are coupled to the plurality of gate structures and the floating diffusion through the interlayer dielectric. In one example, the contacts are further connected to the later-formed metal interconnection layers for connections to the control circuit and the readout circuit.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel circuit, comprising:
    a trench etched into a front side surface of a semiconductor substrate, wherein the trench includes a bottom surface etched along a <100> crystalline plane of the semiconductor substrate and a tilted side surface etched along a <111> crystalline plane of the semiconductor substrate that extends between the bottom surface and the front side surface;
    a floating diffusion disposed in the semiconductor substrate beneath the bottom surface of the trench;
    a photodiode disposed in the semiconductor substrate beneath the tilted side surface of the trench and separated from the floating diffusion, wherein the photodiode is configured to photogenerate image charge in response to incident light; and
    a tilted transfer gate disposed over at least a portion of the bottom surface of the trench and at least a portion of the tilted side surface of the trench, wherein the tilted transfer gate is configured to transfer the image charge from the photodiode to the floating diffusion.

2. The pixel circuit of claim 1, further comprising a gate oxide disposed between the tilted transfer gate and the semiconductor substrate.

3. The pixel circuit of claim 1, wherein the trench further includes a plurality of other side surfaces etched along respective <110> crystalline surfaces of the semiconductor substrate that extend between the bottom surface and the front side surface of the semiconductor substrate.

4. The pixel circuit of claim 1, wherein the tilted side surface of the trench is a first tilted side surface of a plurality of tilted side surfaces of the trench, wherein each one of the plurality of tilted side surfaces is etched along a respective <111> crystalline plane of the semiconductor substrate and extends between the bottom surface and the front side surface of the semiconductor substrate.

5. The pixel circuit of claim 4, wherein the photodiode is a first photodiode of a plurality of photodiodes, wherein each one of the plurality of photodiodes is disposed in the semiconductor substrate beneath a respective one of the plurality of tilted side surfaces of the trench and separated from the floating diffusion.

6. The pixel circuit of claim 5, wherein the tilted transfer gate is a first tilted transfer gate of a plurality of tilted transfer gates, wherein each one of the plurality of tilted transfer gates is disposed over at least a respective portion the bottom surface of the trench and a respective portion of a respective one of the plurality of tilted side surfaces of the trench, wherein each one of the plurality of tilted transfer gates is configured to transfer the image charge from a respective one of the plurality of photodiodes to the floating diffusion.

7. The pixel circuit of claim 6, wherein the plurality of photodiodes, the plurality of tilted side surfaces, and the plurality of tilted transfer gates are arranged symmetrically around the floating diffusion.

8. The pixel circuit of claim 6, wherein the plurality of photodiodes includes four photodiodes, wherein the plurality of tilted side surfaces include four tilted side surfaces, and wherein the plurality of tilted transfer gates includes four tilted transfer gates.

9. The pixel circuit of claim 4, wherein the trench further includes a plurality of other side surfaces etched along respective <110> crystalline surfaces of the semiconductor substrate that extend between the bottom surface and the front side surface of the semiconductor substrate, wherein each one of the plurality of other side surfaces is disposed between a respective neighboring pair of the plurality of tilted side surfaces of the trench.

10. The pixel circuit of claim 1, wherein a slope of an inclined plane formed with the tilted side surface along the <111> crystalline plane of the semiconductor substrate relative to the bottom surface along the <100> crystalline plane of the semiconductor substrate has an angle of approximately 55 degrees.

11. The pixel circuit of claim 1, wherein a depth of the bottom surface of the trench from the front side surface of the semiconductor material is approximately 2000-3000 angstroms.

12. The pixel circuit of claim 1, wherein a charge transfer path of image charge from the photodiode beneath the tilted transfer gate to the floating diffusion and a charge leakage path of image charge from the photodiode through the semiconductor substrate to the floating diffusion are non-overlapping paths.

13. The pixel circuit of claim 12, wherein the charge leakage path of image charge from the photodiode through the semiconductor substrate to the floating diffusion has a length of approximately 1600 to 3600 angstroms through the semiconductor substrate.

14. The pixel circuit of claim 1, wherein the tilted transfer gate is one of a plurality of gate structures included in the pixel circuit, wherein the plurality of gate structures are disposed over the front side surface and the trench into the front side surface of the semiconductor substrate.

15. The pixel circuit of claim 14, further comprising:
    a contact etch stop layer disposed over the plurality of gate structures, the front side surface, and the trench etched into the front side surface of a semiconductor substrate;

an interlayer dielectric disposed over the contact etch stop layer; and
a plurality of contacts, wherein the plurality of contacts include:
a plurality of front side gate structure contacts coupled through the interlayer dielectric to gate structures of the plurality of gate structures that are disposed on the front side surface; and
a floating diffusion contact coupled through the interlayer dielectric to the floating diffusion.

16. The pixel circuit of claim 15, wherein the plurality of contacts further includes a tilted transfer gate contact coupled through the interlayer dielectric to a portion of the tilted transfer gate disposed over the portion of the bottom surface of the trench.

17. The pixel circuit of claim 16, wherein the tilted transfer gate is disposed over a lower portion of the tilted side surface of the trench.

18. The pixel circuit of claim 16, wherein the tilted transfer gate is disposed over the tilted side surface of the trench and is further is leveled with the front side surface of the semiconductor substrate.

19. The pixel circuit of claim 16, wherein the tilted transfer gate is disposed over the tilted side surface of the trench and is further extended over a portion the front side surface of the semiconductor substrate.

20. The pixel circuit of claim 15, wherein the tilted transfer gate is disposed over the tilted side surface of the trench and is further extended over a portion the front side surface of the semiconductor substrate, wherein the plurality of contacts further includes a tilted transfer gate contact coupled through the interlayer dielectric to a portion of the tilted transfer gate disposed over the portion of the front side surface of the semiconductor substrate.

21. The pixel circuit of claim 1, wherein the semiconductor substrate comprises silicon.

22. The pixel circuit of claim 1, wherein the photodiode and the floating diffusion are disposed in an isolation region of the semiconductor substrate.

23. The pixel circuit of claim 1, wherein the trench is etched into the front side surface of the semiconductor substrate with wet anisotropic etching utilizing an etching agent of Tetramethylammonium hydroxide (TMAH).

24. The pixel circuit of claim 23, wherein an etching rate for the <100> crystalline plane is higher than an etching rate for the <110> crystalline plane.

25. The pixel circuit of claim 1, further comprising:
a reset transistor coupled between a supply voltage and the floating diffusion;
a source follower transistor having a gate coupled to the floating diffusion and a drain coupled to the supply voltage; and
a select transistor coupled between a source of the source follower transistor and a bitline.

26. The pixel circuit of claim 1, wherein the pixel circuit is included in a pixel array of an imaging system.

* * * * *